United States Patent
Min

(10) Patent No.: US 9,551,086 B2
(45) Date of Patent: Jan. 24, 2017

(54) METHOD OF PREPARING SILICON CARBIDE POWDER COMPRISING CONVERTING A LIQUID SIC PRECURSOR TO A B-PHASE SIC PARTICULATE MATERIAL

(71) Applicant: LG INNOTEK CO., LTD., Seoul (KR)

(72) Inventor: Kyoung Seok Min, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/406,096

(22) PCT Filed: May 28, 2013

(86) PCT No.: PCT/KR2013/004646
§ 371 (c)(1),
(2) Date: Dec. 5, 2014

(87) PCT Pub. No.: WO2014/051239
PCT Pub. Date: Apr. 3, 2014

(65) Prior Publication Data
US 2015/0197871 A1 Jul. 16, 2015

(30) Foreign Application Priority Data
Sep. 28, 2012 (KR) .................. 10-2012-0109566

(51) Int. Cl.
*C01B 31/36* (2006.01)
*B22F 9/06* (2006.01)
(Continued)

(52) U.S. Cl.
CPC ............... *C30B 1/02* (2013.01); *B22F 1/0011* (2013.01); *B22F 1/0085* (2013.01); *C01B 31/36* (2013.01);
(Continued)

(58) Field of Classification Search
CPC . B22F 1/0011; B22F 1/0085; B22F 2302/105; B22F 2304/10
(Continued)

(56) References Cited

U.S. PATENT DOCUMENTS 4,226,914 A 10/1980 Terner et al.
4,551,436 A 11/1985 Johnson et al.
(Continued)

FOREIGN PATENT DOCUMENTS

KR 10-0544892 B1 1/2006

OTHER PUBLICATIONS

Abderrazak & Hmida, Chapter 16: Silicon carbide: synthesis and properties (pp. 361-388), from the book: Properties and Applications of Silicon Carbide, ISBN 978-953-307-201-2 (536 pages), Apr. 2011.*

(Continued)

*Primary Examiner* — Holly Le
(74) *Attorney, Agent, or Firm* — LRK Patent Law Firm

(57) ABSTRACT

A method of preparing silicon carbide powder is provided, which includes mixing first silicon carbide powder with a liquid silicon carbide precursor, annealing the mixture at a first temperature and converting the silicon carbide precursor to a β-phase silicon carbide particulate material, and annealing the material at a second temperature and grain-growing the first silicon carbide powder to second silicon carbide powder using the β-phase silicon carbide particulate material.

14 Claims, 3 Drawing Sheets

(51) Int. Cl.
  *C30B 1/02* (2006.01)
  *B22F 1/00* (2006.01)
  *C04B 35/565* (2006.01)
  *C04B 35/626* (2006.01)
  *C04B 35/628* (2006.01)
  *C04B 35/65* (2006.01)
  *C30B 1/10* (2006.01)
  *C30B 7/14* (2006.01)
  *C30B 29/36* (2006.01)

(52) U.S. Cl.
  CPC ....... *C04B 35/565* (2013.01); *C04B 35/62645* (2013.01); *C04B 35/62675* (2013.01); *C04B 35/62802* (2013.01); *C04B 35/62834* (2013.01); *C04B 35/65* (2013.01); *C30B 1/10* (2013.01); *C30B 7/14* (2013.01); *C30B 29/36* (2013.01); *B22F 2302/105* (2013.01); *B22F 2304/10* (2013.01); *C01P 2004/60* (2013.01); *C04B 2235/48* (2013.01); *C04B 2235/483* (2013.01); *C04B 2235/5427* (2013.01); *C04B 2235/5436* (2013.01); *C04B 2235/5445* (2013.01); *C04B 2235/72* (2013.01); *C04B 2235/784* (2013.01); *Y10T 428/2982* (2015.01)

(58) Field of Classification Search
  USPC .......................................... 423/345; 428/402
  See application file for complete search history.

(56) References Cited

U.S. PATENT DOCUMENTS

| | | | |
|---|---|---|---|
| 4,913,738 A | | 4/1990 | Tsukada |
| 5,863,325 A | * | 1/1999 | Kanemoto et al. ........... 117/105 |
| 6,627,169 B1 | * | 9/2003 | Itoh et al. ..................... 423/345 |
| 9,409,782 B2 | * | 8/2016 | Kim ........................ C01B 31/36 |
| 9,440,859 B2 | * | 9/2016 | Kim ........................ C01B 31/36 |
| 2007/0032370 A1 | | 2/2007 | Weisensel et al. |
| 2009/0202414 A1 | * | 8/2009 | Mukasyan .............. C01B 31/36 423/345 |
| 2013/0243682 A1 | * | 9/2013 | Park ....................... C01B 31/36 423/346 |

OTHER PUBLICATIONS

Gyu-Mi Kim et al., "Effects of β-SiC Particle Seeds on Morphology and Size of High Purity β-SiC Powder Synthesized using Sol-Gel Process", Journal of the Korean Ceramic Society, vol. 46, No. 5, pp. 528-533, Dec. 2009.

SIPO Office Action for Chinese Patent Application No. 201380050878.X which corresponds to the above-identified U.S. application, (2013).

Search Report for International Application No. PCT/KR2013/004646, (2013).

* cited by examiner

METHOD OF PREPARING SILICON CARBIDE POWDER COMPRISING CONVERTING A LIQUID SIC PRECURSOR TO A B-PHASE SIC PARTICULATE MATERIAL

TECHNICAL FIELD

The present invention relates to silicon carbide powder and a method of preparing the same, and more particularly, to a method of preparing granular silicon carbide powder using fine silicon carbide powder.

BACKGROUND ART

Silicon carbide (SiC) has a high temperature strength, and excellent wear resistance, oxidation resistance, corrosion resistance and creep resistance. Silicon carbide is present in a β phase having a cubic crystal structure and in an α phase having a hexagonal crystal structure. The β phase is stable at a temperature of 1400 to 1800° C., and the α phase is formed at 2000° C. or more.

Silicon carbide is widely used for industrial structures, and has recently been applied in the semiconductor industry. To use silicon carbide in single crystal growth, granular silicon carbide powder having uniform size distribution is needed. The granular silicon carbide powder may be obtained by annealing fine silicon carbide powder under predetermined conditions.

However, when the fine silicon carbide powder is annealed at a temperature lower than 2000° C., β-phase silicon carbide powder having uniform size distribution may be obtained, but granular silicon carbide powder having a size of 40 μm or more is difficult to obtain.

However, when the fine silicon carbide powder is annealed at 2000° C. or more, α-phase silicon carbide powder having a size of 100 μm or more may be obtained, but it has non-uniform size distribution due to the fine silicon carbide powder mixed therein.

DISCLOSURE OF INVENTION

Technical Problem

The present invention is directed to providing granular silicon carbide powder having a uniform size distribution and a method of preparing the same.

Solution to Problem

One aspect of the present invention provides silicon carbide powder having a dispersion (D90/D10) of 1 to 10 and a particle size (D50) of 40 to 150 μm.

The silicon carbide powder may contain impurities at 0.1 to 10 ppm.

The silicon carbide powder may be in a β phase.

Another aspect of the present invention provides a method of preparing silicon carbide powder, which includes mixing first silicon carbide powder with a liquid silicon carbide precursor, converting the silicon carbide precursor to a β-phase silicon carbide particulate material by annealing the mixture at a first temperature, and grain-growing the first silicon carbide powder to second silicon carbide powder using the β-phase silicon carbide particulate material by annealing the β-phase silicon carbide particulate material at a second temperature.

The first silicon carbide powder may have a particle size (D50) of 0.2 to 9 μm.

The silicon carbide precursor may include silicon carbide preceramic polymer series.

The silicon carbide precursor may include at least one selected from the group consisting of silazane and polycarbosilane.

The silicon carbide precursor may be added at 5 to 20 wt % with respect to a total weight of the first silicon carbide powder and the silicon carbide precursor.

The first temperature and the second temperature may be 2000° C. or less.

The β-phase silicon carbide particulate material may be smaller than the particle size (D50) of the first silicon carbide powder.

According to annealing time at the second temperature, a particle size of the second silicon carbide powder may be controlled.

The mixing operation may include coating a surface of the first silicon carbide powder with the liquid silicon carbide precursor.

Advantageous Effects of Invention

According to an exemplary embodiment of the present invention, granular silicon carbide powder having uniform size distribution, which can be used in single crystal growth, can be obtained.

Particularly, as fine silicon carbide powder is treated at a temperature lower than 2000° C., silicon carbide powder having uniform size distribution and a particle size of 40 μm or more may be obtained since the powder is not phase-transferred to an α phase.

MODE FOR THE INVENTION

The present invention will be modified in various forms and have several exemplary embodiments, but only specific embodiments are to be described with reference to drawings. However, it could be understood that the present invention is not limited to specific embodiments disclosed below, but includes all of modifications, equivalents or substitutions in the scope and technical range of the present invention.

Although the terms "first, second, etc." may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

Unless defined otherwise, all of terminology used herein, including technical or scientific terms, has the same meanings as those generally understood by one of ordinary skill in the art to which the present invention belongs. Such terms defined in generally used dictionaries are to be interpreted as having meanings equivalent to the contextual meanings in the related art, and not to be interpreted as having ideal or excessively formal meanings unless clearly defined in the specification.

With reference to the appended drawings, exemplary embodiments of the present invention will be described in detail below. To aid in understanding the present invention, like numbers refer to like elements throughout the description of the figures, and the description of the same elements will be not reiterated.

Figure 1:
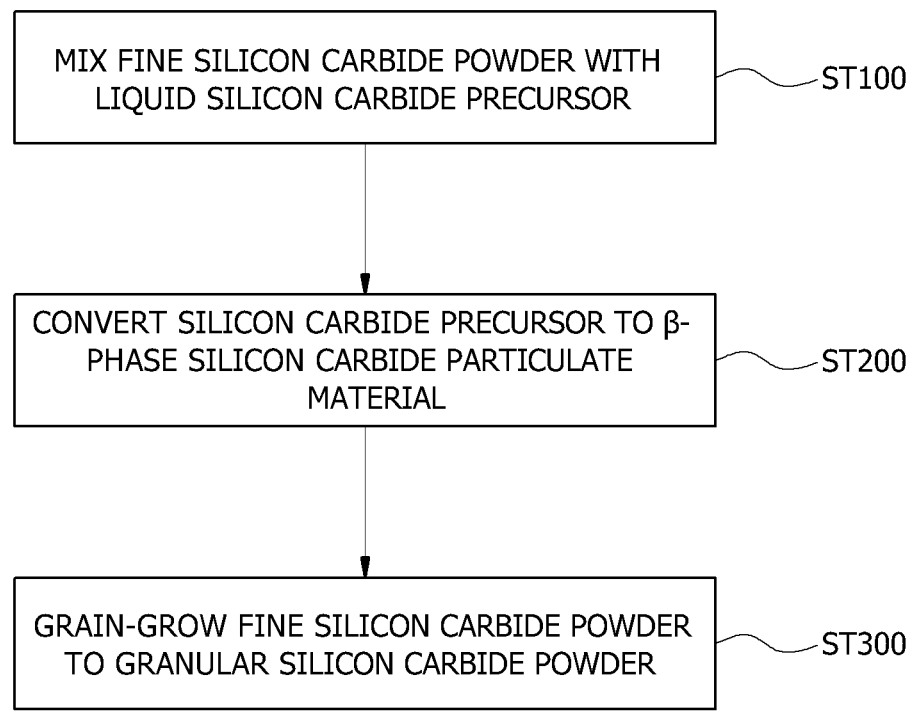
FIG. 1 is a flowchart showing a method of preparing silicon carbide powder according to an exemplary embodiment of the present invention.

FIG. 1 is a flowchart showing a method of preparing silicon carbide powder according to an exemplary embodiment of the present invention. FIGS. 2 to 6 are diagrams showing a method of preparing silicon carbide powder according to an exemplary embodiment of the present invention.

Referring to FIGS. 1 to 6, the method of preparing silicon carbide powder according to an exemplary embodiment includes mixing fine silicon carbide powder with a liquid silicon carbide precursor (ST100), converting the liquid silicon carbide precursor to a β-phase silicon carbide particulate material (ST200), and grain-growing the fine silicon carbide powder to granular silicon carbide powder using the β-phase silicon carbide particulate material (ST300).

Figure 2:
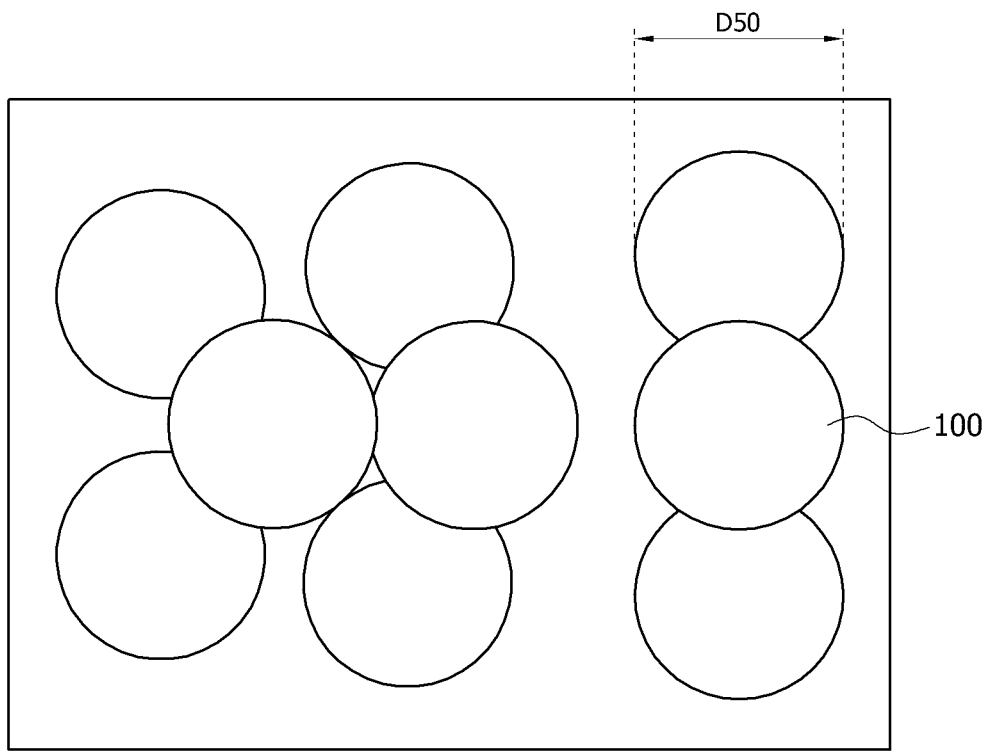
FIGS. 2 to 6 are diagrams showing a method of preparing silicon carbide powder according to an exemplary embodiment of the present invention.
Figure 3:
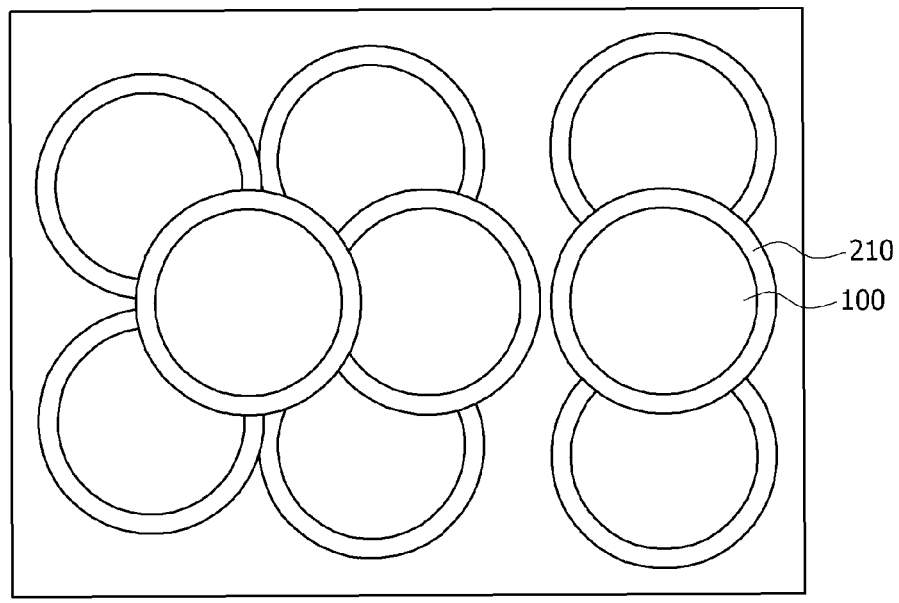

First, referring to FIGS. 2 and 3, fine silicon carbide powder 100 may be prepared for the operation of mixing the fine silicon carbide powder with a liquid silicon carbide precursor (ST100). A particle size (D50) of the fine silicon carbide powder 100 may be 0.2 to 9 µm. According to an exemplary embodiment of the present invention, granular silicon carbide powder (300 of FIG. 6) having a particle size (D50) of 40 to 150 µm may be obtained from the fine silicon carbide powder 100 having a particle size (D50) of 0.2 to 9 µm. In the specification, the fine silicon carbide powder may be used together with first silicon carbide powder, and the granular silicon carbide powder may be used together with second silicon carbide powder.

The fine silicon carbide powder 100 may be obtained by mixing a silicon source providing silicon and a carbon source providing carbon, and heating the mixture. The silicon source may be at least one selected from the group consisting of, for example, fumed silica, silica sol, silica gel, fine silica, quartz powder and a mixture thereof. The solid carbon source may be, for example, at least one selected from the group consisting of graphite, carbon black, carbon nanotubes (CNT), fullerenes and a mixture thereof. An organic carbon compound may be at least one selected from the group consisting of a phenol resin, a franc resin, a xylene resin, polyimide, polyurethane, polyvinyl alcohol, polyacrylonitrile, polyvinyl acetate, cellulose and a mixture thereof. To obtain the fine silicon carbide powder 100, the mixed silicon source and carbon source may be heated at 1700 to 1800° C.

Meanwhile, as shown in FIG. 3, a surface of the fine silicon carbide powder 100 may be coated with the liquid silicon carbide precursor 210 by mixing the fine silicon carbide powder 100 with the liquid silicon carbide precursor 210. Accordingly, material transfer may be facilitated between the fine silicon carbide powder 100 and the silicon carbide precursor 210.

Here, the silicon carbide precursor 210 may include silicon carbide preceramic polymer series. As an example, the silicon carbide precursor 210 may include silazane or polycarbosilane.

The fine silicon carbide powder 100 and the silicon carbide precursor 210 may be mixed using, for example, a ball mill, a spray dry or a Henschel mixer.

In addition, to coat the silicon carbide precursor 210, an organic solvent such as ethanol or isopropylantipyrine (IPA) may be used.

The silicon carbide precursor 210 may be added at 5 to 20 wt % with respect to a total weight of the fine silicon carbide powder 100 and the silicon carbide precursor 210. Such a weight of the silicon carbide precursor 210 is an amount for suitably coating a surface of the fine silicon carbide powder 100.

Figure 4:
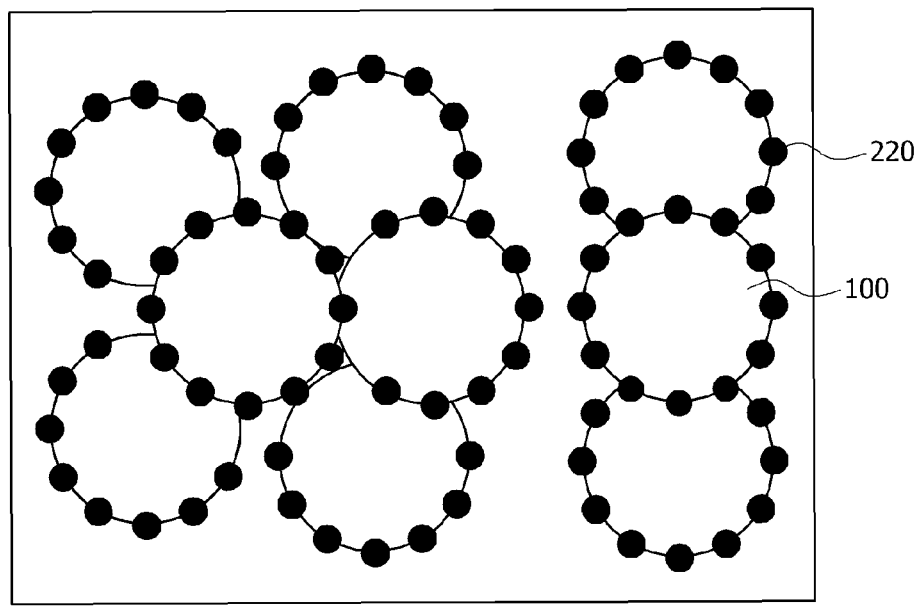

Subsequently, referring to FIG. 4, the fine silicon carbide powder 100 coated with the silicon carbide precursor 210 is annealed at predetermined temperature, and then the silicon carbide precursor 210 is converted to a β-phase silicon carbide particulate material 220 (ST200). The fine silicon carbide powder 100 coated with the silicon carbide precursor 210 may be annealed at, for example, 1500 to 1600° C.

The silicon carbide precursor 210 may be thermally decomposed at 1600° C. or less, and thus converted to the β-phase silicon carbide particulate material 220. Here, the β-phase silicon carbide particulate material 220 may have a superfine (e.g., nm unit) particle size, and may be in a solid phase.

Figure 5:
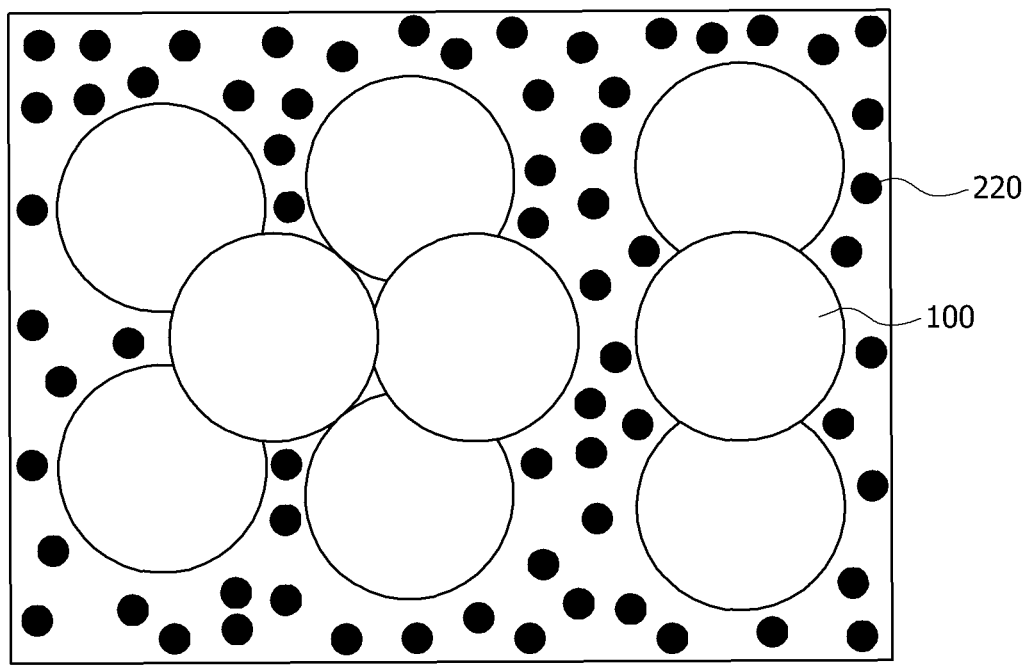

Subsequently, referring to FIGS. 5 and 6, the fine silicon carbide powder 100 is grain-grown to granular silicon carbide powder 300 using the β-phase silicon carbide particulate material by heating at a predetermined temperature (ST300). The β-phase silicon carbide particulate material 220 is disposed among the fine silicon carbide powder 100 to fill pores. Accordingly, material transfer and reaction may be stimulated by a contact of the β-phase silicon carbide particulate material 220 with the fine silicon carbide powder 100. Here, the heating temperature may be 2000° C. or less. As a result, the fine silicon carbide powder 100 may be grain-grown to the granular silicon carbide powder 300 having uniform size distribution, without a phase-transfer to an α phase.

Meanwhile, the annealing may be maintained for 1 to 10 hours. As the annealing time is increased, silicon carbide powder having a high particle size may be obtained. Therefore, the particle size of the silicon carbide powder may be controlled using the annealing time.

In addition, ST200 and ST300 may be continuously or intermittently performed. For example, as a temperature is slowly increased from 1500 to 2000° C., the conversion to a β-phase silicon carbide particulate material (ST200) and the grain-growth of the silicon carbide powder (ST300) may be performed, or the conversion of a n-phase silicon carbide particulate material (ST200) may be performed at a temperature of 1600° C. or less, and then the grain growth of the silicon carbide powder (ST300) may be performed at an increased temperature.

Figure 6:
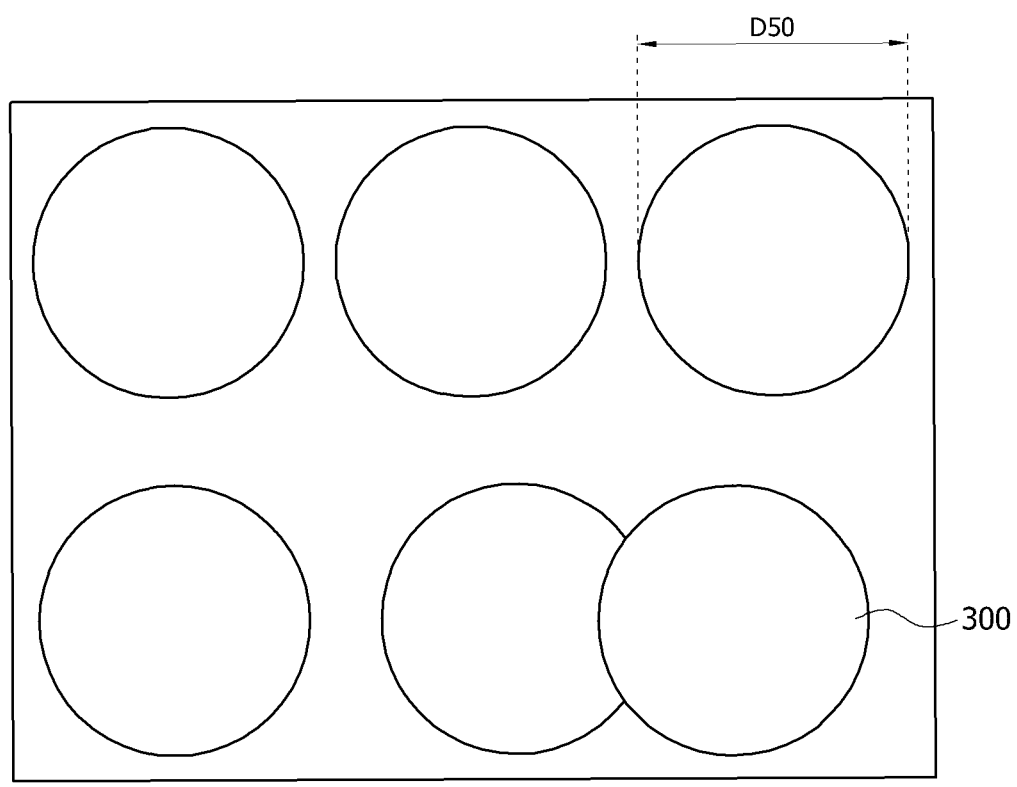

According to an exemplary embodiment of the present invention, as shown in FIG. 6, the granular silicon carbide powder 300 may be prepared. The prepared granular silicon carbide powder 300 is in a β phase, and has uniform size distribution, and a particle size (D50) of 40 to 150 µm. In addition, in the prepared silicon carbide powder 300, impurities are contained at 0.1 to 10 ppm. The size distribution of the silicon carbide powder 300 may be represented by a dispersion (D90/D10). The dispersion of the silicon carbide powder 300 according to an exemplary embodiment of the present invention is 1 to 10. Here, D10 refers to a particle size of powder, which corresponds to a low 10%. In addition, D90 refers to a particle size of powder, which corresponds to a low 90%.

While the invention has been shown and described with reference to certain exemplary embodiments thereof, it will be understood by those skilled in the art that various changes in form and details may be made therein without departing from the scope of the invention as defined by the appended claims.

The invention claimed is:

1. A method of preparing silicon carbide powder, comprising:
    mixing first silicon carbide powder with a liquid silicon carbide precursor;
    annealing the mixture at a first temperature, and converting the silicon carbide precursor to β-phase silicon carbide particulate material; and
    annealing the material at a second temperature, and grain-growing the first silicon carbide powder to second silicon carbide powder using the β-phase silicon carbide particulate material.

2. The method according to claim 1, wherein the first silicon carbide powder has a particle size (D50) of 0.2 to 9 µm.

3. The method according to claim 1, wherein the second silicon carbide powder has a dispersion (D90/D10) of 1 to 10 and a particle size (D50) of 40 to 150 µm, and is in β phase.

4. The method according to claim 3, wherein the second silicon carbide powder has impurities of 0.1 to 10 ppm.

5. The method according to claim 1, wherein the silicon carbide precursor includes at least one selected from the group consisting of silazane and polycarbosilane.

6. The method according to claim 1, wherein the silicon carbide precursor is added at 5 to 20 wt % with respect to a total weight of the first silicon carbide powder and the silicon carbide precursor.

7. The method according to claim 1, wherein the silicon carbide precursor includes silicon carbide preceramic polymer series.

8. The method according to claim 1, wherein the first temperature and the second temperature are 2000° C. or less.

9. The method according to claim 8, wherein the first temperature is 1500° C. to 1600° C.

10. The method according to claim 1, wherein the β-phase silicon carbide particulate material is smaller than the particle size (D50) of the first silicon carbide powder.

11. The method according to claim 10, wherein the β-phase silicon carbide particulate material has a nm unit particle size and is in a solid phase.

12. The method according to claim 1, wherein a particle size of the second silicon carbide powder is controlled according to annealing time at the second temperature.

13. The method according to claim 1, wherein the mixing comprises coating a surface of the first silicon carbide powder with the liquid silicon carbide precursor.

14. The method according to claim 13, wherein an organic solvent is used for the coating.

* * * * *